US007474530B2

(12) United States Patent
Stewart et al.

(10) Patent No.: US 7,474,530 B2
(45) Date of Patent: Jan. 6, 2009

(54) HIGH-LOAD EVEN PRESSURE HEATSINK LOADING FOR LOW-PROFILE BLADE COMPUTER APPLICATIONS

(75) Inventors: Thomas E. Stewart, San Diego, CA (US); Daniel Hruska, San Carlos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 58 days.

(21) Appl. No.: 11/651,762

(22) Filed: Jan. 10, 2007

(65) Prior Publication Data

US 2008/0165501 A1    Jul. 10, 2008

(51) Int. Cl.
*H05K 7/20* (2006.01)
*H01L 23/427* (2006.01)

(52) U.S. Cl. .................. 361/704; 361/709; 361/710; 361/719; 361/720; 165/80.3; 165/104.33; 165/185; 174/16.3; 174/252; 411/508; 411/544; 411/552; 248/505; 248/510; 257/718

(58) Field of Classification Search ......... 361/703–712, 361/714–717, 719–721; 257/706–727; 174/15.1, 174/16.3, 252; 165/80.3, 104.33, 185; 248/505, 248/510; 24/297, 457–458, 453
See application file for complete search history.

(56) References Cited

U.S. PATENT DOCUMENTS

| 5,648,890 | A  | * | 7/1997  | Loo et al. ............... 361/704 |
| 6,611,431 | B1 | * | 8/2003  | Lee et al. ............... 361/719 |
| 6,679,712 | B2 | * | 1/2004  | Chang ..................... 439/248 |
| 7,116,556 | B2 | * | 10/2006 | Lee et al. ............... 361/704 |
| 7,126,823 | B2 | * | 10/2006 | Chen et al. .............. 361/702 |
| 7,262,969 | B2 | * | 8/2007  | Lee et al. ............... 361/704 |
| 7,283,368 | B2 | * | 10/2007 | Wung et al. ............. 361/719 |
| 7,342,796 | B2 | * | 3/2008  | Aukzemas ............... 361/719 |
| 7,359,200 | B2 | * | 4/2008  | Zhou et al. .............. 361/704 |
| 2005/0072558 | A1 | * | 4/2005  | Whitney et al. ......... 165/80.3 |
| 2006/0245165 | A1 | * | 11/2006 | Lin ........................ 361/704 |

* cited by examiner

*Primary Examiner*—Michael V Datskovskiy
(74) *Attorney, Agent, or Firm*—Osha-Liang LLP

(57) ABSTRACT

An apparatus for dissipating heat in a computer system includes a heat sink, at least one fastener which secures the heat sink to at least one first support member, and at least one cup. The first support member has a top side and a bottom side. The at least one cup includes a cylindrical cavity, an upper protruding lip, and a lower base having a hole through which the at least one fastener passes. A method for dissipating heat in a computer system includes, mounting a heat emitting component onto a printed circuit board, pressing a heat sink into thermal contact with a heat emitting component, inserting a cup into an aperture of the heat sink, and supporting a heat sink.

18 Claims, 5 Drawing Sheets

HIGH-LOAD EVEN PRESSURE HEATSINK LOADING FOR LOW-PROFILE BLADE COMPUTER APPLICATIONS

BACKGROUND OF INVENTION

1. Field of the Invention

This invention relates to dissipating heat generated by heat emitting components.

2. Background Art

As the desire for more intensive electronic applications increases, so does the demand for electrical systems that operate at faster speeds, occupy less space, and provide more functionality. To meet these demands, manufacturers design modules containing numerous components with different package types, such as integrated circuits (ICs), multi-chip modules (MCMs), hybrids, and the like, residing in relatively close proximity on a common substrate, for example, a printed circuit board (PCB). Certain components residing on the PCB, such as a central processing unit (CPU) or processor, generate large amounts of heat which must be dissipated.

Generally, heat is dissipated by transferring the heat to a heat-sinking medium such as air or water. Due to the expense and complexity associated with liquid media and, in many cases, the non-availability of such media, it is desirable to use air as a sinking medium. Heat-transfer from the heat source to the surrounding air is accomplished via direct contact between a component and the surrounding atmosphere, passive thermal transfer schemes (e.g., heat pipes), or active liquid cooling systems (e.g., a closed loop circulating cooling system) or a combination of these schemes. In the case of direct contact, heat transfer is generally enhanced by placing a thermally conductive heat sink with protruding fins in contact with an area of high heat flux, such as the upper surface of a component's package or the component's "face." The heat sink fins greatly increase the heat transfer area to the surrounding atmosphere and reduce the thermal resistance between the heat source and heat sink. Typically, the surrounding air circulates over the heat sink fins by convection; however, in order to further enhance the heat transfer to the surrounding atmosphere, a fan may be used to mechanically move air over the heat sink fins.

In order to enhance the transfer of heat within the heat sink itself, some heat sinks include one or more heat pipes. Other heat sinks are attached to a separate housing having one or more heat pipe. Heat pipes provide a thermally efficient conduit for transferring heat from small areas of high heat generation uniformly throughout the heat sink in order to create a nearly isothermal surface on the heat sink.

In the prior art, an individual heat sink is typically adhesively bonded (e.g., with a thermosetting, conducting epoxy) and/or mounted adjacent to the face of a single heat-generating component with fastening devices (e.g., clips, retaining rings, press fits, or the like). For a computer having a reasonable number of components, with ample height and spacing available, the prior art use of such heat sinks and fastening devices is usually effective for transferring heat away from the critical components of a circuit board.

SUMMARY OF INVENTION

An apparatus for dissipating heat in a computer system comprising a heat sink, at least one fastener which secures the heat sink to at least one first support member, wherein the first support member has a top side and a bottom side, and at least one cup comprising a cylindrical cavity, an upper protruding lip, and a lower base having a hole through which the at least one fastener passes.

A method for dissipating heat in a computer system, the method comprising, mounting a heat emitting component onto a PCB, pressing a first heat sink into thermal contact with a heat emitting component, inserting a cup into an aperture of the heat sink, supporting a heat sink above the PCB with at least one spring-loaded screw, the PCB having at least one hole.

DETAILED DESCRIPTION

Figure 1:
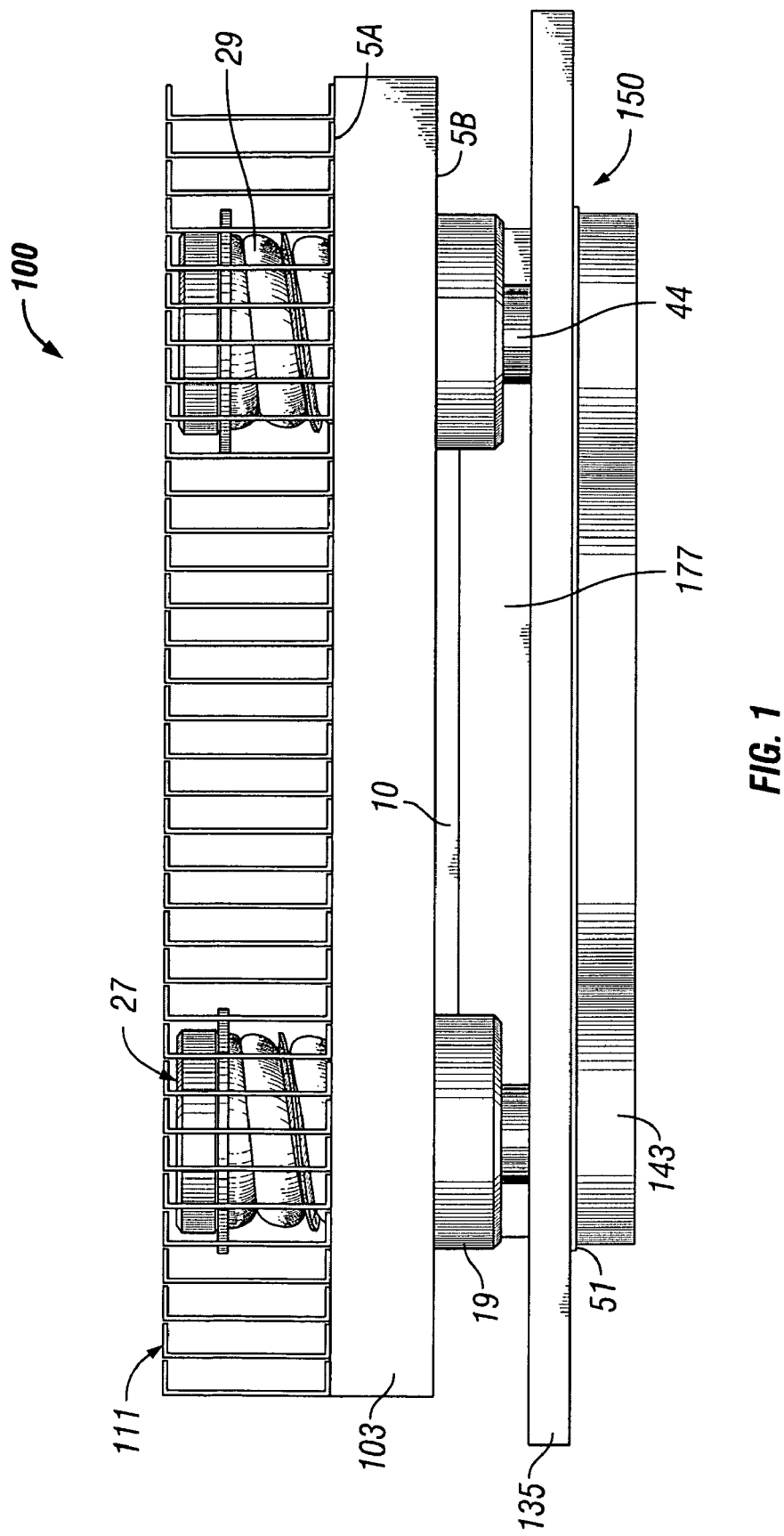
FIG. 1 shows a front view of a heat dissipating apparatus in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Referring initially to FIG. 1, a front view of a heat dissipating apparatus 100 is shown mounted on a printed circuit board (PCB) in accordance with one or more embodiments of the present invention. In this embodiment, the apparatus 100 includes a rectangular heat sink base 103. The heat sink base 103 has a first side 5a and a second side 5b, such that the second side 5b is in thermal contact with at least one heat emitting component 177 such as an electronic chip or die. At least one heat emitting component 177 is mounted on top of PCB 135. Additionally, heat sink base 103 may include a plurality of fins 111 that extend upwards from first side 5a. During use, at least one heat emitting component 177 generates heat. Fins 111 dissipate heat conducted from the heat emitting component 177 into the surrounding environment. One of ordinary skill in the art will appreciate that heat sink (103, 111) may be comprised of any material with high heat conductivity known in the art such as aluminum, copper, beryllium, or white metal. Further, it will be understood that heat sink base 103 and fins 111 are subject to wide variation in shape and components 177.

The apparatus 100 also includes a supporting assembly 150, such that at least one strut 44 may be attached through apertures (not shown) in the PCB 135 to bolster plate 143. The bolster plate 143 may be disposed below the PCB 135 opposite to the side on which the heat emitting component 177 is mounted. Further, supporting assembly 150 may include an insulating sheet 51 disposed between bolster plate 143 and PCB 135. One of ordinary skill in the art will appreciate that at least one bolster plate 143 may be comprised of, for example, stainless steel, aluminum or other suitable material known in the art. In another embodiment, the bolster plate 143 may be omitted and the struts 44 may be mounted directly on the PCB 135.

Figure 2:
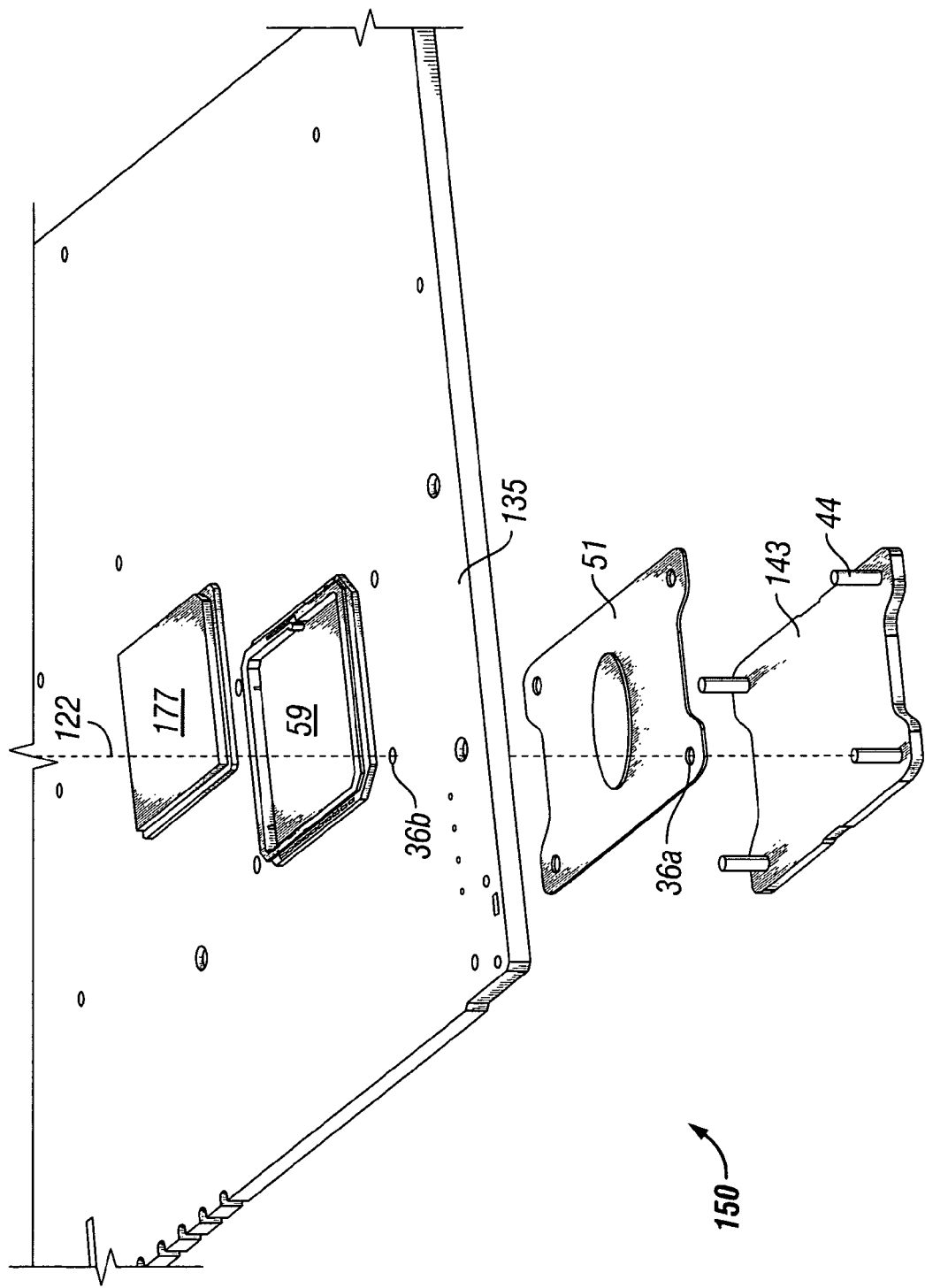
FIG. 2 shows an exploded view of a heat dissipating apparatus in accordance with one or more embodiments of the present invention.

FIG. 2 is an exploded view of the supporting assembly 150 shown in FIG. 1. Referring to FIG. 2, the supporting assembly 150 includes a PCB 135 and at least one heat emitting component 177 mounted thereon. Further, the supporting assembly 150 includes a planar rectangular bolster plate 143 and a planar insulating sheet 51. Insulating sheet 51 may be disposed between bolster plate 143 and PCB 135. Additionally, as seen in FIG. 2, the bolster plate 143 includes four struts 44. Those of ordinary skill in the art will appreciate that while certain numbers and locations of struts 44 and bolster plates 143 are shown, any number of combinations may be used. In an alternative embodiment, insulating sheet 51 may be eliminated such that PCB 135 is in direct contact with bolster plate 143.

Each strut 44 may pass through corresponding apertures (36a, 36b), which are provided in the insulating sheet 51 and the PCB 135, as shown by dashed line 122 in FIG. 2. The distribution of the struts 44 with respect to the heat sink base 103 may take any suitable form. In this embodiment, a square formation is used such that a strut 44 is disposed at each corner of bolster plate 143. Further, the heat emitting component 177 in this embodiment may be mounted in a socket 59, which may itself be mounted on the PCB 135. The heat emitting component 177 and socket 159 are disposed in-between the apertures 36b on the PCB board, as shown in FIG. 2. Alternatively, in another embodiment, at least one heat emitting component 177 may be mounted directly on the PCB. One of ordinary skill in the art will appreciate that electrical connections between the heat emitting component 177, the socket 59 and the PCB 135 may be formed by any method known in the art such as, for example, a ball grid array (BGA) or a series of pin connections.

Referring back to FIG. 1, in this embodiment, the apparatus 100 further includes at least one fastener 27 such as a spring-loaded screw. At least one fastener 27 threadably attaches to at least one strut 44 where each strut 44 may be mounted on the bolster plate 143 such that heat sink 103 may be secured to the PCB 135. To comply with predetermined height specifications, the heat sink base 103 may be disposed closer to PCB 135 than the conventional method allows. Further, the fastener 27 may be inserted through a drop-down cup 19 embedded in the heat sink 103, such that a spring 29 on the fastener 27 may be disposed lower than the second side 5b of the base. In another embodiment, as discussed above, bolster plate 143 and insulating sheet 51 may be eliminated, and fastener 27 may be threadably attached to struts 44 mounted on the PCB 135. Alternatively, struts 44 may be eliminated entirely, and PCB 135 may include threaded holes to threadably engage with at least one fastener 27.

Figure 3:
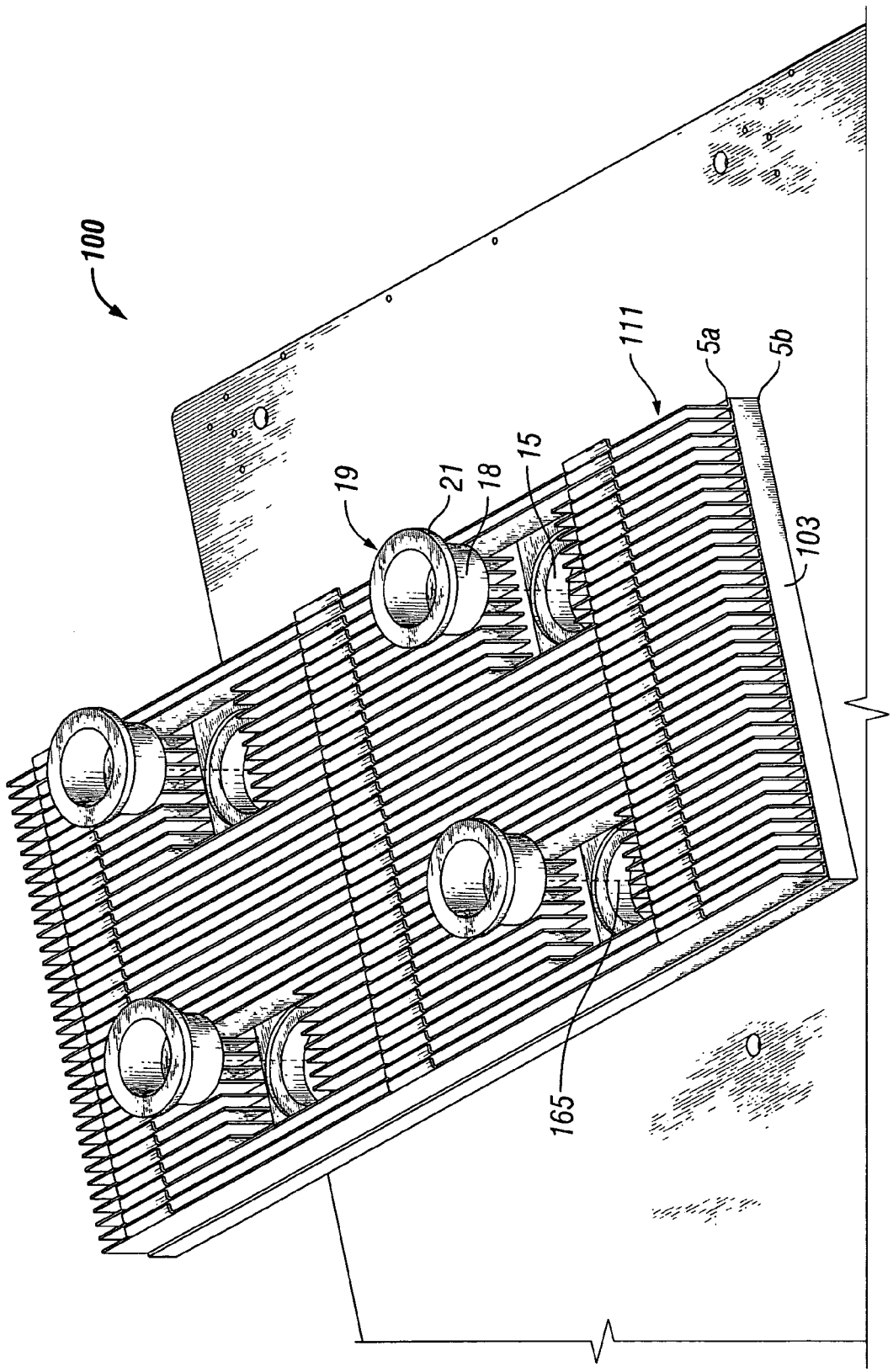
FIG. 3 shows a perspective view of a heat dissipating apparatus in accordance with one or more embodiments of the present invention.
Figure 4:
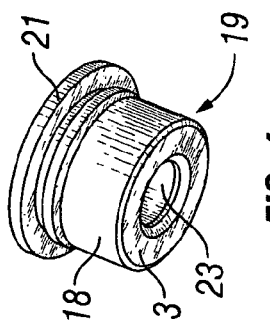
FIG. 4 shows a drop-down cup in accordance with one or more embodiments of the present invention.

FIGS. 3 and 4 show perspective views of a heat sink (103, 111) and drop-down cups 19 in accordance with the heat sink apparatus 100 shown in FIG. 1. While four drop down cups 19 are shown in FIG. 3, one of ordinary skill in the art will appreciate that any number of drop-down cups 19 may be used without departing from the scope of the present invention. Drop-down cup 19 includes an upper protruding lip 21 mounted on top of a cylindrical cavity 18. In this embodiment, drop-down cup 19 includes a lower base 3 having a hole 23 through which at least one fastener 27 passes. One of ordinary skill in the art will appreciate that drop-down cup 19 may be comprised of any suitable material known in the art, for example, steel.

Each drop-down cup 19 is inserted through the heat sink base 3 as illustrated by dashed line 165. As shown in FIG. 3, at least one aperture 15 is embedded in base 103. Each aperture 15 embedded in base 103 extends from first side 5a to second side 5b of base 103. Further, aperture 15 may be disposed in any area of the heat sink base 103 and configured to receive a drop-down cup 19. Each aperture 15 may be disposed in an area where no fins 11 are disposed such that the drop down cup 19 may be inserted. Further, a portion of the first side 5a of the base 103 is cut away around each aperture 15 such that the upper protruding lip 21 of each drop-down cup 19 is flush with the first side 5a of the base 103 when inserted. The cylindrical cavity 18 hangs below the base 103 portion while the upper protruding lip 21 rests on top of the cut away portion as shown in FIGS. 1 and 7. One of ordinary skill in the art will appreciate that in other embodiments, upper protruding lip 21 may rest on top of first side 5a of base 103 instead of being flush with first side 5a.

Figure 5:
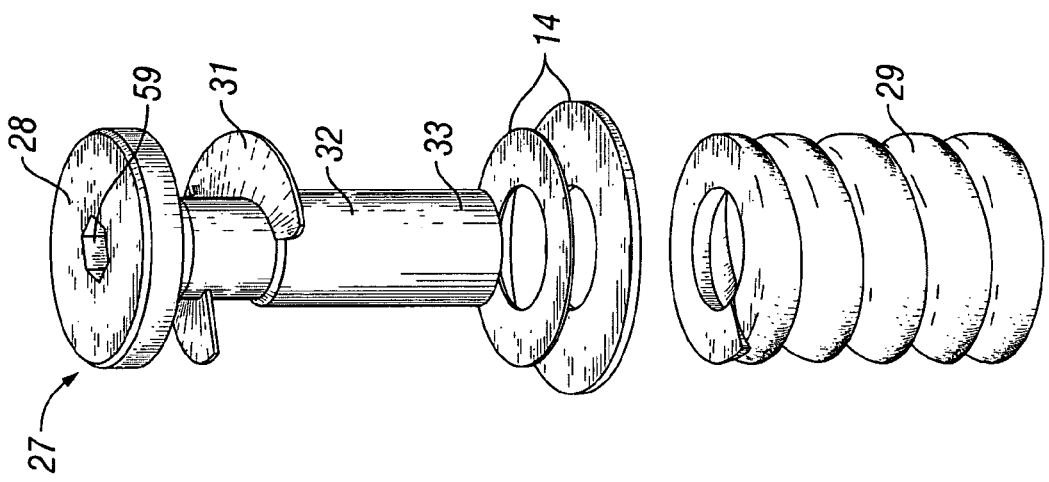
FIG. 5 shows a perspective view of a heat dissipating apparatus in accordance with one or more embodiments of the present invention.
Figure 6:
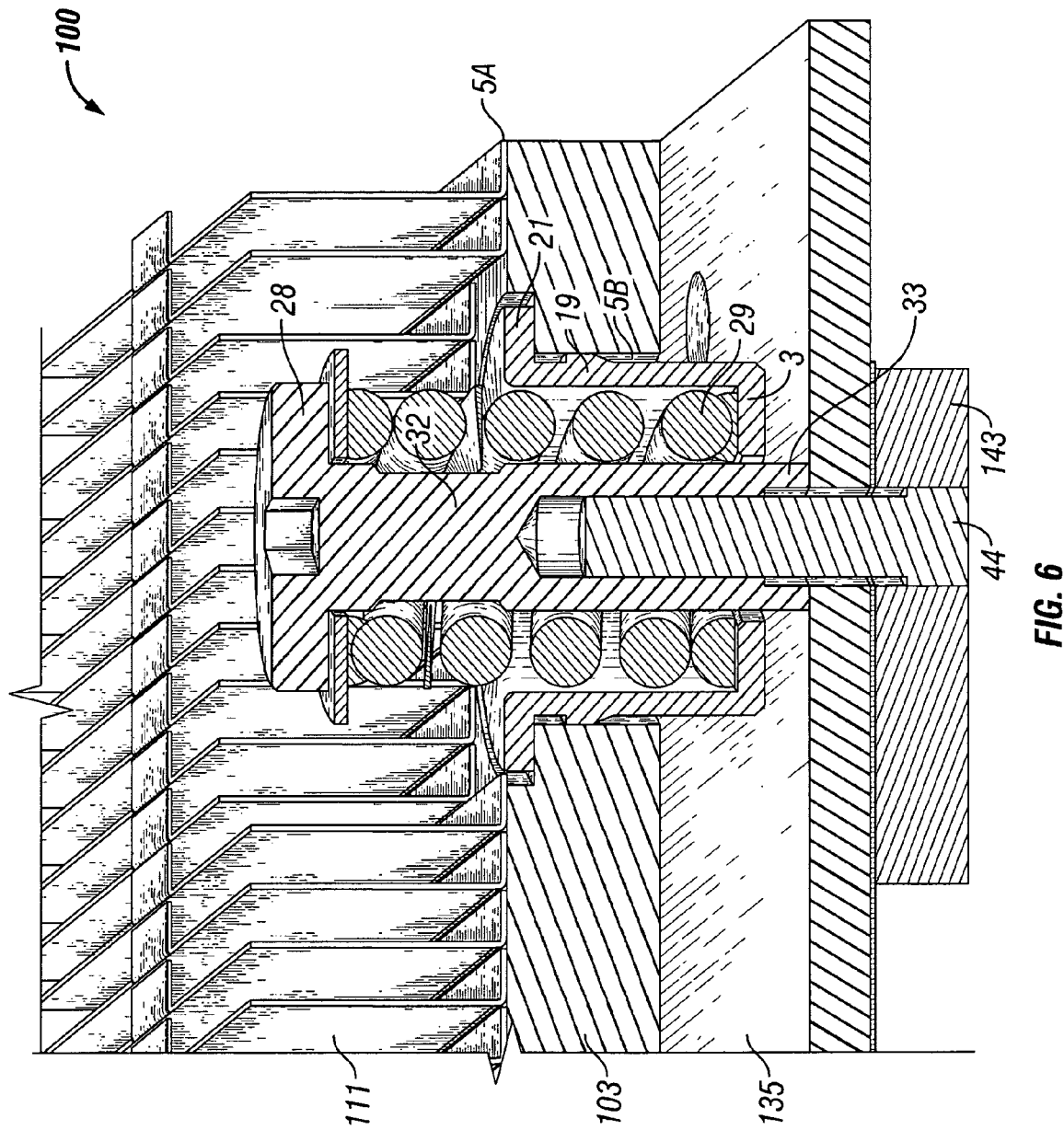
FIG. 6 shows a exploded view of a spring-loaded screw in accordance with one or more embodiments of the present invention.

The drop-down cups 19 are configured to receive at least one fastener 27, such as a spring-loaded screw, to compress the heat sink to the heat emitting member (not shown) and secure it to the PCB 135 as shown in FIG. 6. The spring-loaded screws, as depicted in greater detail in FIG. 5 (not drawn to scale) in accordance with the heat sink apparatus 100 depicted in FIG. 1, includes a head 28 and a cylindrical body 32. In one or more embodiments, the head 28 has a socket 59, such as an allen socket, a hex socket, or another socket type that is known to those ordinary skilled in the art. Further, the head 28 has a greater diameter than the diameter of the cylindrical body 32.

In the embodiment shown in FIG. 5, a planar C-shaped member 31 is rotatably mounted on the cylindrical body 32 and disposed proximate head 28. Further, at least one washer 14 is rotatably mounted on the cylindrical body 32. While two washers 14 are shown in FIG. 5, one of ordinary skill in the art will appreciate that any number of washers may be used, for example, zero, one, two, or three. The washers 14 are slid onto the cylindrical body 32 such that C-shaped member 31 stops the first washer 14 from coming in contact with head 28.

A spring 29 is coiled around the cylindrical body 32. Spring 29, e.g., an off-the-shelf die spring, surrounds cylindrical body 32 such that cylindrical body 32 and spring 29 have a common longitudinal axis. Further, the cylindrical body 32 has a tip portion 33 extending distal from the head 28. The tip portion 33 has a diameter smaller than the hole 23 of drop-down cup 19, as shown in FIG. 4, allowing tip 33 to pass through hole 23 in a downward direction.

Now referring to FIG. 6, a cross-section view of a heat dissipating apparatus 100 is shown in accordance with the embodiment shown in FIG. 1. As tip portion 33 passes through hole 23 of cup 19, the spring 29 which is coiled around cylindrical body 32, is disposed within cup 19 such that the diameter of spring 29 is greater than the hole 23 diameter, so that spring 29 does not pass through hole 23, and instead, rests on top of lower base 3 of drop-down cup 19.

Further, the cylindrical body 32 and the tip portion 33 of the spring-loaded screw includes internal screw threads (not shown) for threadably securing heat sink 103 to corresponding strut 44. Strut 44 includes external screw threads and has a diameter smaller than diameter of tip portion 33, such that strut 44 may be screwed into the spring-loaded screw. One of ordinary skill in the art will appreciate that in other embodiments, tip portion may alternatively include external screw threads to threadably engage internal screw threads of a corresponding strut 44. The diameter of the tip portion is smaller than strut 44 diameter, so that tip portion 33 is screwed into strut 44. In other embodiments, tip portion 33 may include external screw threads to threadably engage a corresponding threaded hole in the PCB 135. Further, other embodiments may include a head 28, a cylindrical body 32, a threaded tip portion 33, and an elastomeric sleeve positioned around the cylindrical body 32.

Referring back to FIG. 6, as spring-loaded screw 27 is tightened to respective strut 44, the spring 29 presses downwards against base 3 of cup 19 and upwards toward screw head 28. As a result, spring 29 is in a compressed state, such that spring 29 urges heat sink (103, 111) downward toward at least one heat emitting component (not shown). The action of spring 29 to urge base 103 against heat emitting component may improve the thermal contact between the base 103 portion and the heat emitting component thereby providing enhanced cooling. The action of the springs 29 to urge the base 103 against the heat emitting component also has the effect of urging the heat emitting component toward the PCB 135. Whether the heat emitting component may be mounted directly on the PCB 135 or may be mounted in a socket 59, as shown in FIG. 2, this has the effect of holding the heat emitting component 177 in place and ensuring that any electrical connections between the heat emitting component 177 and the socket 59/PCB 135 are maintained. One of ordinary skill in the art will appreciate that spring 29 used in spring-loaded screw may be, for example, an off the shelf die spring, or any equivalent thereof with optimum loading characteristics.

Additionally, in one or more embodiments in accordance with the present invention, a layer of thermally conductive material (not shown) such as thermally conductive grease or a thermal pad may be provided for an adequate thermal path at the interface between the base 103 and the heat emitting component 177 in the area generally shown in FIG. 1 by reference numeral 10. Thus, the face of at least one heat emitting component 177 is covered with filling material. Preferably, the shape and area of the filling material substantially coincides with the shape and area of the heat emitting component 177 faces. It will be appreciated that the choice of the thermal-conductive filling material enables an efficient thermal, as well as compliant, interface between the bottom surface of the heat sink and the heat emitting component 177 faces. This can further improve the thermal contact between the base 103 and at least one heat emitting component 177.

In one or more embodiments, the heat dissipating apparatus may also include one or more heat pipes that are inserted into a machined recess in heat sink. The internal construction of such heat pipes is conventional and will not be described further. The heat pipes may also be affixed to the bottom of heat sink. As will be appreciated by those skilled in the art, the heat pipes serve to spread the heat generated by heat emitting components evenly across the heat sink.

One or more embodiments of the present invention may include one or more of the following advantages. Heat sinks may be disposed closer to the printed circuit board to comply with height limitations. Springs may be lowered below the heat sink to comply with height limitations. The design of one or more embodiments of the heat dissipating apparatus allows for proper and consistent loading on processors mounted on the printed circuit board while still complying with height limitations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for dissipating heat in a computer system comprising:
    a heat sink comprising:
        a base portion comprising a first side and a second side;
    at least one fastener which secures the heat sink to at least one first support member, wherein the first support member has a top side and a bottom side; and
    at least one cup comprising a cylindrical cavity, an upper protruding lip, and a lower base having a hole through which the at least one fastener passes,
    wherein at least one aperture is embedded in the base portion and is configured to receive the at least one cup wherein a cylindrical body of the at least one cup hangs below the base portion, and
    wherein a portion of the first side of the base portion is cut away around the at least one aperture where the at least one cup is received such that an upper protruding lip of the at least one cup is flush wit the first side of the base portion.

2. The apparatus according to claim 1, wherein the heat sink further comprises
    a plurality of fins protruding from the first side of the base portion.

3. The apparatus according to claim 1, wherein the heat sink further comprises:
    a plurality of apertures, wherein each aperture is configured to receive a cup; and
    a plurality of cups, wherein each cup is configured to receive a fastener.

4. The apparatus according to claim 1, wherein the first support member further comprises at least one threaded hole that provides a point of attachment for the fastener.

5. The apparatus according to claim 1, wherein the first support member is a printed circuit board.

6. The apparatus according to claim 1, wherein the first support member is a bolster plate comprising:
    a planar area for receiving and supporting a second support member; and
    at least one strut attached to the top side and extending longitudinally above the bolster plate, wherein the at least one strut comprises screw threads.

7. The apparatus according to claim 6,
    wherein the second support member is a printed circuit board;
    wherein at least one heat emitting member is mounted on the printed circuit board, the printed circuit board comprising:
        a first side;
        a second side; and
        at least one hole through which the strut of the first support member passes from the second side of the printed circuit board to threadably engage with the fastener.

8. The apparatus according to claim 7 further comprising a third support member, wherein the third support member is an insulated sheet disposed between the bolster plate and the printed circuit board and comprising at least one opening through which the at least one strut passes.

9. The apparatus according to claim 1, wherein the at least one fastener is a spring-loaded screw comprising:
    a head attached to one end of a cylindrical body and having a head diameter larger than the diameter of the cylindrical body;

the cylindrical body having a tip portion extending distal from the head, and having a diameter smaller than the hole of the cup through which the tip portion passes, wherein the tip portion comprises screw threads for threadably engaging screw threads of the first support member; and a spring coiled around the cylindrical body, such that when the tip portion passes through the hole of the cup, the spring is disposed within the cup wherein the spring presses against the lower base of the cup.

10. The apparatus according to claim 9, wherein the at least one spring loaded screw further comprises:

a planar C-shaped member attached to the cylindrical body and disposed proximate the head and above the spring;

at least one washer rotatably mounted on the cylindrical body and comprising a center diameter larger than the diameter of the cylindrical body and disposed between the spring and the planar C-shaped member.

11. The apparatus according to claim 6, wherein the at least one fastener is a spring-loaded screw comprising:

a head attached to one end of a cylindrical body and having a head diameter larger than the diameter of the cylindrical body;

the cylindrical body having a tip portion extending distal from the head, and having a diameter smaller than the hole of the cup through which the tip portion passes, wherein the tip portion comprises screw threads for threadably engaging screw threads of the first support member; and a spring coiled around the cylindrical body, such that when the tip portion passes through the hole of the cup, the spring is disposed within the cup wherein the spring presses against the lower base of the cup.

12. The apparatus according to claim 11, wherein the at least one spring loaded screw further comprises:

a planar C-shaped member attached to the cylindrical body and disposed proximate the head and above the spring;

at least one washer rotatably mounted on the cylindrical body and comprising a center diameter larger than the diameter of the cylindrical body and disposed between the spring and the planar C-shaped member.

13. The apparatus according to claim 1 further comprising thermal-conductive material disposed between the heat sink and the first support member wherein the thermal-conductive material is in contact with at least one heat emitting member.

14. A method for dissipating heat in a computer system, the method comprising:

mounting a heat emitting component onto a printed circuit board;

pressing a first heat sink into thermal contact with a heat emitting component, the first heat sink having at least one aperture embedded on a base portion thereof, a first side of the base portion being cut away around the at least one aperture such that an upper protruding lip of the at least one cup is flush with the first side of the base portion;

inserting a cup into an aperture of the heat sink; and supporting a heat sink above the printed circuit board with at least one spring-loaded screw, the printed circuit board having at least one hole.

15. The method of claim 14 further comprising:

supporting the printed circuit board with a bolster plate, the bolster plate comprising a strut that passes through the hole and threadably engaging with the spring-loaded screw.

16. The method of claim 14 further comprising:

providing an insulating sheet between a bolster plate and the printed circuit board, the insulating sheet comprising an opening through which a strut passes.

17. The method of claim 14 further comprising:

controlling a force exerted by the heat sink on the heat emitting component with the spring loaded screw.

18. The method of claim 14 further comprising:

compressing the spring between a screw head and the base of the cup.

* * * * *